(12) United States Patent
Kim et al.

(10) Patent No.: US 9,159,659 B2
(45) Date of Patent: Oct. 13, 2015

(54) SEMICONDUCTOR PACKAGE AND METHOD OF MANUFACTURING THE SEMICONDUCTOR PACKAGE

(71) Applicant: SAMSUNG Electronics Co., Ltd., Suwon-si, Gyeonggi-do (KR)

(72) Inventors: Sang-Won Kim, Seoul (KR);
Kwang-Chul Choi, Suwon-si (KR);
Hyun-Jung Song, Hwaseong-si (KR);
Cha-Jea Jo, Bucheon-si (KR);
Eun-Kyoung Choi, Hwaseong-si (KR);
Ji-Seok Hong, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 4 days.

(21) Appl. No.: 13/835,969

(22) Filed: Mar. 15, 2013

(65) Prior Publication Data

US 2013/0299969 A1 Nov. 14, 2013

(30) Foreign Application Priority Data

May 11, 2012 (KR) .................. 10-2012-0050076

(51) Int. Cl.
| | | |
|---|---|---|
| *H01L 23/49* | (2006.01) | |
| *H01L 23/498* | (2006.01) | |
| *H01L 21/56* | (2006.01) | |

(Continued)

(52) U.S. Cl.
CPC .......... *H01L 23/49811* (2013.01); *H01L 21/56* (2013.01); *H01L 21/561* (2013.01); *H01L 21/563* (2013.01); *H01L 21/76898* (2013.01); *H01L 23/3114* (2013.01); *H01L 23/3128* (2013.01); *H01L 23/481* (2013.01); *H01L 24/97* (2013.01); *H01L 25/0657* (2013.01); *H01L 29/0657* (2013.01); *H01L 2224/16145* (2013.01); *H01L 2224/16225* (2013.01); *H01L 2224/16238* (2013.01); *H01L 2224/97* (2013.01); *H01L 2225/06513* (2013.01); *H01L 2225/06517* (2013.01); *H01L 2225/06565* (2013.01);

(Continued)

(58) Field of Classification Search
CPC ........... H01L 2924/01079; H01L 2924/01029; H01L 2924/01078; H01L 2924/01013
USPC .................. 257/737, 774, E23.067, E23.068, 257/E21.577
See application file for complete search history.

(56) References Cited

U.S. PATENT DOCUMENTS

| | | |
|---|---|---|
| 6,245,595 B1 | 6/2001 | Nguyen et al. |
| 7,691,672 B2 * | 4/2010 | Hatano et al. .................. 438/107 |

(Continued)

FOREIGN PATENT DOCUMENTS

| | | |
|---|---|---|
| KR | 20090066517 | 6/2009 |
| KR | 20110016018 | 2/2011 |

(Continued)

*Primary Examiner* — Monica D Harrison
(74) *Attorney, Agent, or Firm* — Ellsworth IP Group PLLC

(57) ABSTRACT

A semiconductor package includes a first semiconductor chip, a second semiconductor chip and a sealing member. The first semiconductor chip includes a substrate having a first surface and a second surface opposite to the first surface and having an opening that extends in a predetermined depth from the second surface, and a plurality of through electrodes extending in a thickness direction from the first surface, end portions of the through electrodes being exposed through a bottom surface of the opening. The second semiconductor chip is received in the opening and mounted on the bottom surface of the opening. The sealing member covers the second semiconductor chip in the opening.

16 Claims, 14 Drawing Sheets

(51) Int. Cl.
*H01L 23/31* (2006.01)
*H01L 23/00* (2006.01)
*H01L 23/48* (2006.01)
*H01L 25/065* (2006.01)
*H01L 29/06* (2006.01)
*H01L 21/768* (2006.01)

(52) U.S. Cl.
CPC ............. *H01L2924/15156* (2013.01); *H01L 2924/15311* (2013.01); *H01L 2924/18161* (2013.01)

(56) References Cited

U.S. PATENT DOCUMENTS

| | | |
|---|---|---|
| 2009/0200662 A1 | 8/2009 | Ng et al. |
| 2009/0280602 A1 | 11/2009 | Bonifield et al. |
| 2010/0019368 A1 | 1/2010 | Shin |
| 2011/0051378 A1 | 3/2011 | Wang et al. |
| 2011/0062592 A1 | 3/2011 | Lee et al. |
| 2011/0198638 A1 | 8/2011 | Wang |
| 2011/0237027 A1 | 9/2011 | Kim et al. |
| 2011/0248400 A1 | 10/2011 | Onodera et al. |
| 2012/0248600 A1* | 10/2012 | Shigezane et al. ............ 257/737 |

FOREIGN PATENT DOCUMENTS

| | | |
|---|---|---|
| KR | 20110048733 | 5/2011 |
| KR | 10-1060119 | 8/2011 |
| KR | 20110107989 | 10/2011 |

\* cited by examiner

SEMICONDUCTOR PACKAGE AND METHOD OF MANUFACTURING THE SEMICONDUCTOR PACKAGE

CROSS-REFERENCE TO RELATED APPLICATIONS

This application claims priority under 35 U.S.C. §119 from Korean Patent Application No. 2012-50076, filed on May 11, 2012 in the Korean Intellectual Property Office (KIPO), the entire contents of which are herein incorporated by reference.

BACKGROUND

1. Field

Example embodiments relate to a semiconductor package and a method of manufacturing the semiconductor package. More particularly, example embodiments relate to a semiconductor package including at least two semiconductor chips stacked on each other and a method of manufacturing the semiconductor package.

2. Description of the Related Art

Semiconductor packages are becoming miniaturized and lightweight according to the miniaturization trend of electronic products using semiconductor devices. For example, in order to minimize a mounting area, a stack package including at least two unit semiconductor chips stacked on a wafer level has been researched.

In the wafer level package, the stacked semiconductor chips may include a through electrode or plug that penetrates the semiconductor chip. A connection member such as a metal bump may be disposed on the through electrode to electrically connect the semiconductor chips to each other. The through electrode called through-silicon via (TSV) can be used for the wafer level package. For example, the through electrode may be formed using copper (Cu) having a low resistance.

Conventionally, after the through electrode is formed in a semiconductor such as a wafer, a backside of the substrate may be planarized until an end portion of the through electrode is exposed through the backside of the substrate. By performing the planarization process, the thickness of the substrate may be decreased. Accordingly, a high-cost wafer supporting system (WSS) may be required to handle the thin wafer for following processes. Further, the through electrodes may be damaged by the planarization process.

SUMMARY

Example embodiments provide a semiconductor package having a structure capable of reducing manufacturing costs and improve yield rates.

Example embodiments provide a method of manufacturing the semiconductor package.

Additional features and utilities of the present general inventive concept will be set forth in part in the description which follows and, in part, will be obvious from the description, or may be learned by practice of the general inventive concept The foregoing and/or other features and utilities of the present general inventive concept may be achieved by providing a semiconductor package including a first semiconductor chip, a second semiconductor chip and a sealing member. The first semiconductor chip includes a substrate having a first surface and a second surface opposite to the first surface and having an opening that extends in a predetermined depth from the second surface, and a plurality of through electrodes extending in a thickness direction from the first surface, end portions of the through electrodes being exposed through a bottom surface of the opening. The second semiconductor chip is received in the opening and mounted on the bottom surface of the opening. The sealing member covers the second semiconductor chip in the opening.

The second semiconductor chip may be electrically connected to the first semiconductor chip via bumps that are disposed on exposed end portions of the through electrodes.

The second semiconductor chip may be mounted by a flip chip bonding technology.

The first semiconductor chip may include circuit patterns on the first surface of the substrate.

The semiconductor package may further include an upper insulation layer including wirings on the first surface of the substrate and the wirings may be electrically connected to the circuit patterns.

A plurality of outer connection pads may be formed on the upper insulation layer.

The semiconductor package may further include a protection layer pattern on a sidewall and the bottom surface of the opening to expose the end portions of the through electrodes.

A sidewall of the opening may have an inclination angle with respect to a direction perpendicular to the substrate.

The first semiconductor chip may be a logic chip including a logic circuit and the second semiconductor chip may be a memory chip including a memory circuit.

The semiconductor package may further include a third semiconductor chip received in the opening and stacked on the second semiconductor chip.

The foregoing and/or other features and utilities of the present general inventive concept may also be achieved by providing a method of manufacturing a semiconductor package, the method including forming a substrate having a first surface and a second surface opposite to the first surface and including a plurality of through electrodes extending in a thickness direction from the first surface. An opening is formed to extend in a predetermined depth from the second surface and expose end portions of the through electrodes a bottom surface of the opening. A semiconductor chip is mounted on the bottom surface in the opening. A sealing member is formed in the opening to cover the semiconductor chip.

The method may further include, after forming the opening, forming a protection layer pattern on a sidewall and the bottom surface of the opening to expose the end portions of the through electrodes.

The forming the protection layer pattern may include forming a protection layer in the opening along the profile of the end portions of the through electrode, forming a photoresist pattern that exposes the protection layer formed on the end portions of the through electrodes, and partially removing the protection layer exposed by the photoresist pattern to form the protection layer pattern.

The mounting the semiconductor chip may include mounting the semiconductor chip on the bottom surface of the opening via bumps that are disposed on the end portions of the through electrodes respectively.

One or more circuit patterns may be formed on the first surface of the substrate, an upper insulation layer including wirings may be formed on the first surface of the substrate, and the wirings may be electrically connected to the circuit patterns.

The forgoing and/or other features and utilities of the present general inventive concept may also be achieved by providing a method of manufacturing a semiconductor package, the method including, after a plurality of through electrodes is formed in a substrate to extend in a thickness direction from a lower surface of the substrate, forming an opening in a predetermined depth from an upper surface of the substrate to expose end portions of the through electrodes through a bottom surface of the opening. Then, after a semiconductor chip is mounted on the bottom surface of the opening in the opening, a sealing member may be formed in the opening to cove the semiconductor chip.

The middle portion of the substrate may be partially removed to form the opening that exposes the end portions of the through electrodes. Accordingly, the peripheral region of the substrate outside the opening may still have a relatively thick thickness. Therefore, since the wafer except the openings still has a relatively thick thickness to prevent the warpage of the wafer, following processes may be performed without using a high-cost wafer supporting system.

The forgoing and/or other features and utilities of the present general inventive concept may also be achieved by providing a semiconductor package usable with an electronic apparatus, including a first semiconductor chip including a substrate and an opening formed in the substrate as a recess, one or more second semiconductor chips disposed in the opening of the substrate, and a sealing member disposed in the opening to cover the one or more second semiconductor chips.

The opening may be defined by a bottom surface and a side wall disposed around the bottom surface, and the sealing member may be disposed between the one or more second semiconductor chips and a surface formed with the bottom surface and the side wall of the opening.

The side wall may have a width variable according to a height from the bottom surface.

The substrate may include one or more through electrodes exposed from the bottom surface of the substrate, and the one or more second semiconductor chips may be disposed on the one or more through electrodes opening, and the sealing member may be formed between the adjacent through electrodes.

The substrate of the first semiconductor chip may include one or more solder bumps connectable to a controller of the electronic apparatus, and the controller of the electronic apparatus performs an operation according to data received from the semiconductor package.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE EMBODIMENTS

Figure 1:
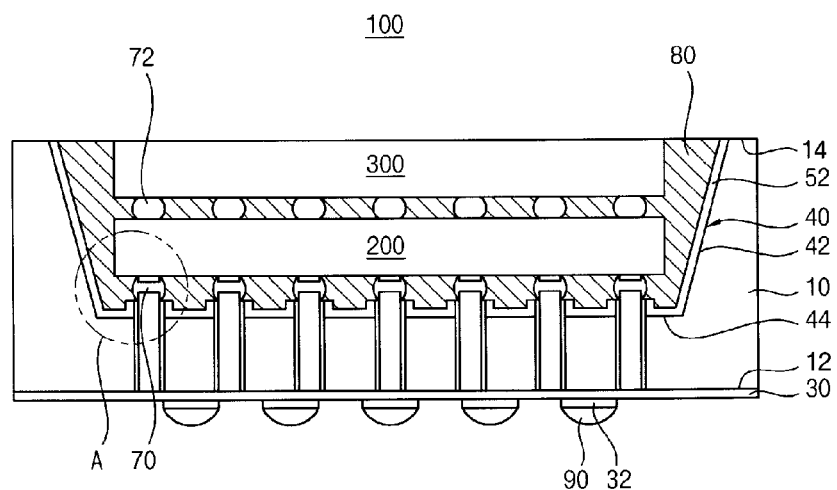
FIG. 1 is a cross-sectional view illustrating a semiconductor package according to an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures. Example embodiments may, however, be embodied in many different forms and should not be construed as limited to example embodiments set forth herein. Rather, these example embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
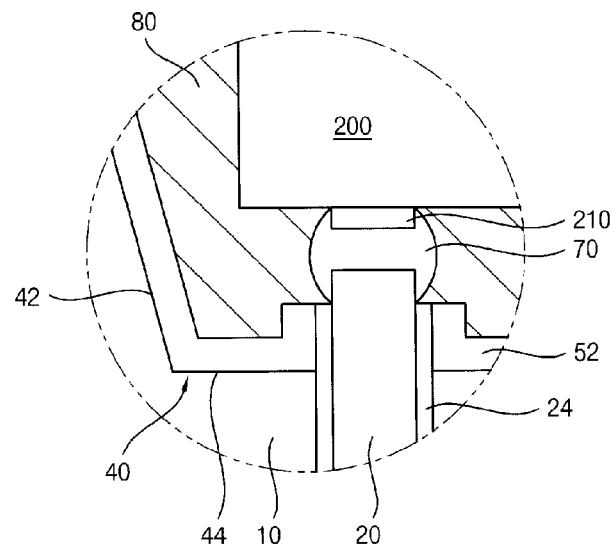
FIG. 2 is an enlarged view illustrating "A" portion in FIG. 1.

FIG. 1 is a cross-sectional view illustrating a semiconductor package 100 according to an embodiment of the present general inventive concept. FIG. 2 is an enlarged view illustrating an "A" portion of FIG. 1.

Referring to FIGS. 1 and 2, the semiconductor package 100 includes a first semiconductor chip having a substrate 10 with an opening 40 formed therein as a recess portion, a second semiconductor chip 200 received in the opening 40 and mounted on a bottom surface 44 of the opening 40, a third semiconductor chip 300 stacked on the second semiconductor chip 200 and a sealing member 80 covering the second semiconductor chip 200 and the third semiconductor chip 300 in the opening 40.

In example embodiments, the first semiconductor chip may include the substrate 10 having a first surface 12 and a second surface 14 opposite to the first surface 12. Circuit patterns 17 (see FIG. 4) may be formed in and/or on the first surface 12 of the substrate 10. The circuit patterns 17 may include a transistor, a diode, a capacitor, etc. The circuit patters 17 may constitute circuit elements.

The circuit element may include a plurality of memory devices. Examples of the memory devices may be a volatile memory device and a non-volatile memory device. The volatile memory device may include dynamic random access memory (DRAM), static random access memory (SRAM), etc. The non-volatile memory device may include erasable programmable read-only memory (EPROM), electrically erasable programmable read-only memory (EEPROM), flash EEPROM, etc.

The first semiconductor chip may include a plurality of through electrodes 20. The through electrode 20 may extend from the first surface 12 of the substrate 10 in a thickness direction. End portions of the through electrodes 20 may be exposed through the bottom surface 44 of the opening 40. For example, through silicon via (TSV) may be used as the through electrode 20.

An insulation layer pattern 24 may be formed on the through electrode 20 to insulate between the substrate 10 and the through electrode 20. For example, the insulation layer pattern 24 may include silicon oxide, carbon-doped silicon oxide, etc.

An upper insulation layer 30 including one or more wirings 34 (see FIG. 4) may be formed on the first surface 12 of the substrate 10. The wirings 34 may be electrically connected to the circuit patterns 17 and/or the through electrodes 20. The upper insulation layer 30 may include silicon oxide, silicon nitride, silicon oxynitride, etc. Outer connection pads 32 may be formed over the first surface 12 of the substrate 10 to be electrically connected to the wirings 34 and/or the circuit patterns 17. The outer connection pads 32 may be exposed by the upper insulation layer 30.

The opening 40 may be formed to have a predetermined depth from the second surface 14 of the substrate 10. The opening 40 may expose a plurality of the through electrodes 20 that penetrate the substrate 10. The opening 40 may have a rectangular shape when viewed from a plan view. The through electrodes 20 may be formed in the opening 40 to have a matrix array.

The opening 40 may have a sidewall 42 and the bottom surface 44. The end portions of the through electrodes 20 may be exposed through the bottom surface 44 of the opening 40. The sidewall 42 may be formed to have an inclination angle with respect to a direction perpendicular to the substrate 10.

Accordingly, a middle portion of the substrate 10 where the opening 40 is formed may be a relatively thin, while a peripheral portion of the substrate 10 outside the opening 40 may be a relatively thick.

According to an embodiment, a protection layer pattern 52 may be formed on the sidewall 42 and the bottom surface 44 of the opening 40 to expose the end portions of the through electrodes 20.

The second semiconductor chip 200 may be received in the opening 40 of the substrate 10. The second semiconductor chip 200 may be mounted on the bottom surface 44 of the opening 40. The third semiconductor chip 300 may be stacked on the second semiconductor chip 200. A sealing member 80 may be formed in the opening 40 to cover the second semiconductor chip 200 and the third semiconductor chip 300.

The second semiconductor chip 200 may be mounted by a flip chip bonding technology. The second semiconductor chip 200 may be mounted on the bottom surface 44 of the opening 40 via bumps 70 that are disposed on end portions of the through electrodes 20 respectively. The second semiconductor 200 may be formed with a pad 210 to be connected to the bump 70. The third semiconductor chip 300 may be electrically connected to the second semiconductor chip 200 by bumps 72.

The sealing member 80 may perform functions of underfilling and encapsulation of the second semiconductor chip 200. Since the sealing member 80 is formed in the opening 40 to cover the semiconductor chips, the amount of the sealing member to be required to cover the semiconductor chip may be decreased, to thereby improve process reliability and reduce manufacturing costs.

In an embodiment, the semiconductor package 100 may be a system in package (SIP). The first semiconductor chip may be a logic chip including a logic circuit. The second semiconductor chip 200 may be a memory chip including a memory circuit. The third semiconductor chip 300 may be also a memory chip. The memory circuit may include a memory cell region for storing data and/or a memory logic region for operating the memory chip.

The first semiconductor chip may include a circuit portion having functional circuits. The functional circuits may include a transistor or a passive device such as resistance, capacitor, etc. The functional circuits may include a memory control circuit, an external input/output circuit, a micro input/output circuit and/or an additional functional circuit, etc. The memory control circuit may provide a data signal and/or a memory control signal to operate or control the second semiconductor chip 200. For example, the memory control signal may include an address signal, command signal, or clock signal.

The through electrodes 20 may be used as an electrical path to transmit a signal or power required to an operation of the second semiconductor chip 200 and/or the third semiconductor chip 300. The signal may include a data signal and a control signal. The power may include a power voltage (VDD) and a ground voltage (VSS).

Accordingly, the data signal and/or the control signal may be transmitted from the memory control circuit of the first semiconductor chip to the second semiconductor chip 200. The power voltage (VDD) and/or the ground voltage (VSS) may be supplied to the second semiconductor chip 200 through the through electrodes 20.

Hereinafter, a method of manufacturing the semiconductor package 100 of FIG. 1 will be explained.

FIGS. 3 to 17 are views illustrating a method of manufacturing a semiconductor package 100 of FIG. 1 according to an embodiment of the present general inventive concept. FIGS. 3, 5, 7, 9, 11, 13, 15 and 17 are cross-sectional views illustrating the method of manufacturing the semiconductor package 100 according to an embodiment of the present general inventive concept. FIG. 4 is an enlarged view illustrating the through electrode 17 of the semiconductor package 100 of FIG. 4. FIG. 6 is a plan view illustrating the opening 40 formed in the substrate 10 of FIG. 5. FIG. 8 is an enlarged view illustrating a "B" portion of FIG. 7. FIG. 10 is an enlarged view illustrating a "C" portion of FIG. 9. FIG. 12 is an enlarged view illustrating a "D" portion of FIG. 11. FIG. 14 is an enlarged view illustrating "E" portion in FIG. 13.

Figure 3:
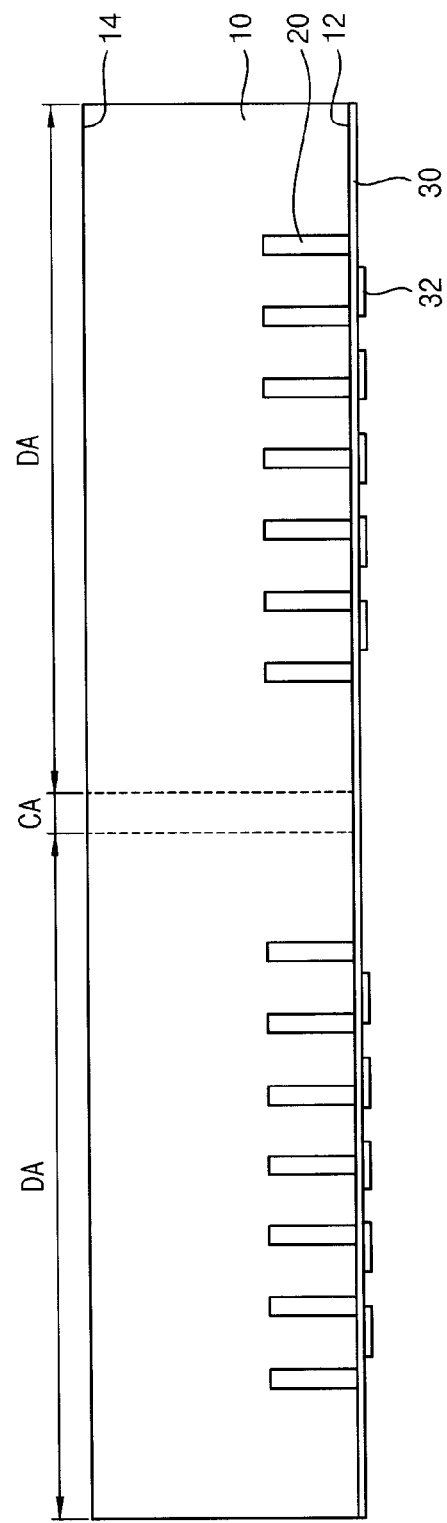
FIGS. 3 to 17 are views illustrating a method of forming a semiconductor package according to an embodiment of the present general inventive concept.
Figure 4:
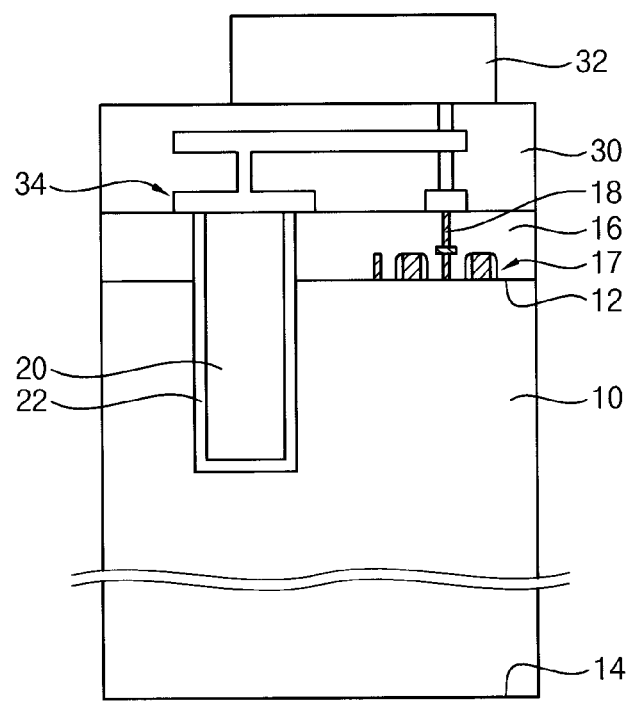

Referring to FIGS. 3 and 4, the substrate 10 including first preliminary semiconductor chips formed therein may be prepared. The substrate 10 may have a first surface 12 and a second surface 14 disposed opposite to the first surface 12.

The substrate 10 may be a single-crystalline silicon wafer. The substrate 10 may include a die region (DA) and a cutting region (CA). The first preliminary semiconductor chip may be formed in the die region (DA). The preliminary semiconductor chips may be separated by the cutting region (CA). The substrate 10 may be diced along the cutting region (CA) to form respective first semiconductor chips.

As illustrated in FIG. 4, circuit patterns 17 may be formed on the first surface 12 of the substrate 10. The circuit patterns may include a transistor, a diode, a capacitor, etc. The circuit patterns 17 may constitute circuit elements. Accordingly, a first preliminary semiconductor chip including a plurality of the circuit elements formed in the die region (DA) may be formed in the wafer.

The circuit element may include a plurality of memory devices. Examples of the memory devices may be a volatile memory device and a non-volatile memory device. The volatile memory device may include dynamic random access memory (DRAM), static random access memory (SRAM), etc. The non-volatile memory device may include erasable programmable read-only memory (EPROM), electrically erasable programmable read-only memory (EEPROM), flash EEPROM, etc.

An insulation interlayer 16 may be formed on the first surface 12 of the substrate 10 to cover the circuit patterns 17. An etch stop layer (not illustrated) may be formed on the insulation interlayer 16. Accordingly, a wafer process called as FEOL (front-end-of-line) process may be performed to form the circuit patterns 17 on the substrate 10.

As described later, in this embodiment, after the circuit patterns 17 are formed on the substrate 10, a through electrode 20 may be formed to extend from the first surface 12 into the substrate 10.

The through electrode 20 may be through silicon via (TSV) that extends from the first surface 12 in a predetermined depth into the substrate 10. An insulation layer 22 may be formed on the through electrode 20 to insulate between the substrate 10 and a conductive material of the through electrode 20. For example, the insulation layer 22 may be formed using silicon oxide or carbon-doped silicon oxide.

Then, a wiring process called as BEOL (back-end-of-line) process may be performed to form an upper insulation layer 30. Wirings 34 may be formed in the upper insulation layer 30 to be electrically connected to the circuit patterns 17. The upper insulation layer 30 may be formed using silicon oxide, silicon nitride, silicon oxynitride, etc. Outer connection pads 32 may be formed over the first surface 12 of the substrate 10 through the upper insulation layer 30. The outer connection pads 32 may be exposed by the upper insulation layer 30. An electrical connection 18 can be formed to connect the circuit patterns 17 to the wirings 34 and/or the outer connection pad 32.

Figure 5:
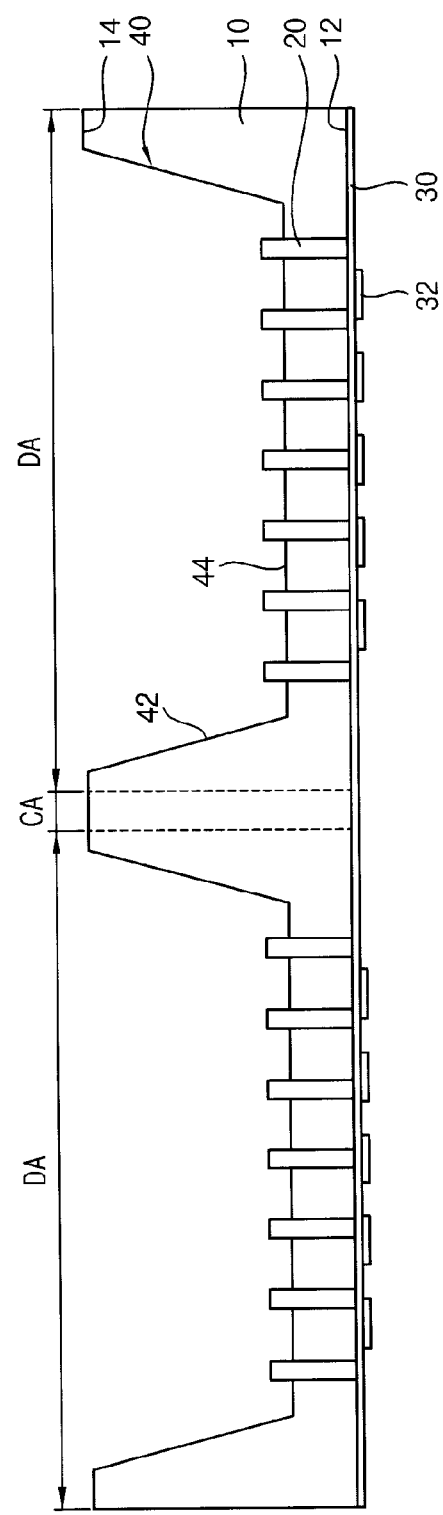
Figure 6:
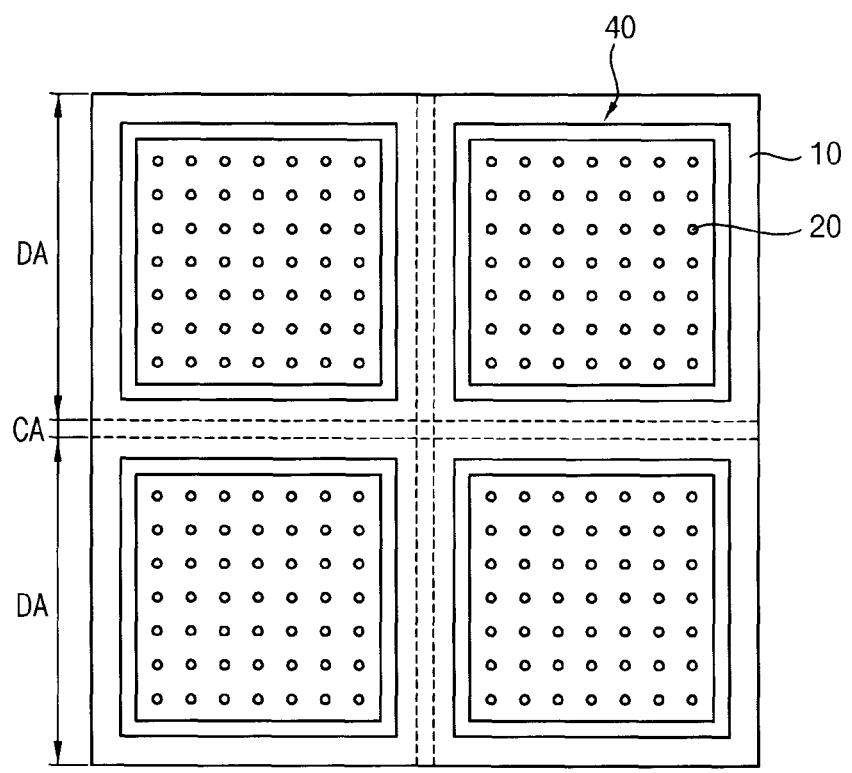

Referring to FIGS. 5 and 6, an opening 40 may be formed to have a predetermined depth from the second surface 14 of the substrate 10 and expose end portions of the through electrodes 20.

In example embodiments, a photoresist pattern (not illustrated) may be formed on the second surface 14 of the substrate 10 to expose a region where a plurality of the through electrodes 20 is formed in the die region (DA). Then, the substrate 10 may be partially removed using the photoresist pattern as an etching mask to form the opening 40 having a predetermined depth from the second surface 14 of the substrate 10. For example, the opening 40 may be formed by a wet etching process.

The opening 40 may expose a plurality of the through electrodes 20 in the die region (DA). For example, the through electrodes 20 may be formed in the opening 40 to have a matrix array. The opening 40 may have a rectangular shape when viewed from a plan view.

The opening 40 may have a sidewall 42 and a bottom surface 44. Accordingly, the end portions of the through electrodes 40 in the die region (DA) may be exposed through the bottom surface 44 of the opening 40 by a distance. The sidewall 42 of the opening 40 may be formed to have an inclination angle with respect to a direction perpendicular to the substrate 10 and/or with respect to a direction parallel to a major surface of the bottom surface 44 or the through electrodes 20.

The side wall 42 may have a width in a direction parallel to the major surface of the bottom surface 44 or the through electrodes 20. The width may be variable according to a distance from the major surface of the bottom surface 44 or the through electrodes 20. The width of the side wall 42 may include a first width corresponding to the second surface 14 and a second width at a point connected to the bottom surface 44. The second width may be similar to a thickness of the substrate 10 between the bottom surface 44 and the first surface 12. The thickness of the substrate 10 may not be variable with respect to the first surface 12. However, the present general inventive concept is not limited thereto. It is possible that the thickness of the substrate 10 may be variable within a margin allowable according to a design or user preference.

It is also possible that the angle of the side wall 42 with the direction perpendicular to the substrate 10 may be determined according to a design and user preference. It is possible that the angle of the side wall 42 may be determined according to a size of the semiconductors to be disposed in the opening 40.

A length of the second semiconductor 200 may be shorter than a length of the bottom surface 44. A length of the third semiconductor 300 may be same as the length of the second semiconductor. However, the present general inventive concept is not limited thereto. It is possible that the length of the third semiconductor may be different from the length of the second semiconductor. The lengths of the second and third semiconductors may be spaced apart from the side wall 42.

In the embodiment, since a middle portion of the substrate 10 is partially removed to form the opening 40, the middle portion of the substrate 10 may be a relatively thin, while a peripheral portion of the substrate 10 outside the opening 40 may be a relatively thick.

When through electrodes are formed in a substrate, the whole backside of the substrate may be removed by a planarization process until the through electrodes are exposed. By performing the planarization process, the substrate may have a relatively thin thickness. Accordingly, a wafer supporting system (WSS) may be required to handle the thin wafer for following processes. Further, the through electrodes may be damaged by the planarization process.

In the embodiment, the peripheral region of the die region (DA) outside the opening 40 may still have a relatively thick thickness. Accordingly, since a wafer except the openings 40 still has a relatively thick thickness to prevent the warpage of the wafer, following processes may be performed without using the high-cost wafer supporting system.

Further, without performing a planarization process on the whole surface of the wafer, a wet etching process may be performed on only a local surface of the wafer to form the opening 40 that exposes the end portions of the through electrodes 20, to thereby prevent the through electrodes from being damaged.

Figure 7:
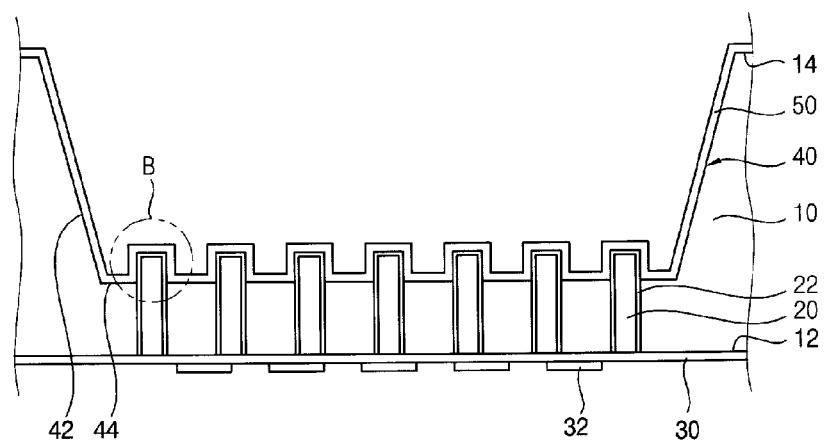
Figure 8:
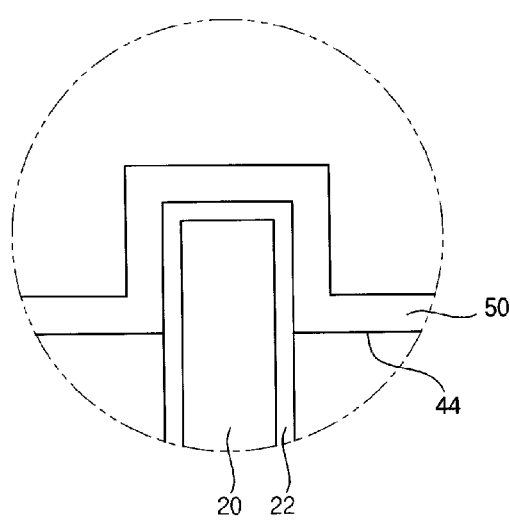

Referring to FIGS. 7 and 8, a protection layer 50 may be formed on the second surface 14 of the substrate 10 and a portion defining the opening 40.

In the embodiment, the protection layer 50 may be formed along the second surface 14 of the substrate 10, the sidewall 42 and the bottom surface 44 of the opening 40 and the exposed end portions of the through electrodes 20. The protection layer 50 may be formed along a profile of the insulation layer 22 that is formed on the end portion of the through electrode 20.

For example, the protection layer 50 may be formed using silicon oxide or carbon-doped silicon oxide having excellent step coverage characteristics. The protection layer 50 may be formed by chemical vapor deposition (CVD) process, plasma enhanced chemical vapor deposition (PECVD) process, atomic layer deposition (ALD) process, low pressure chemical vapor deposition (LPCVD) process, sputtering process, etc.

Figure 9:
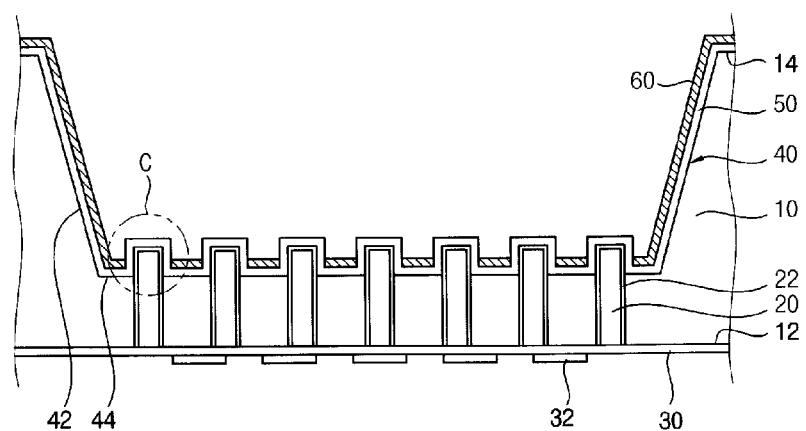
Figure 10:
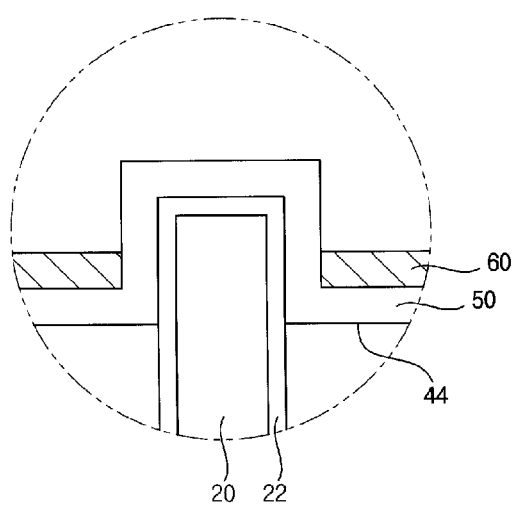

Referring to FIGS. 9 and 10, a photoresist pattern 60 may be formed to expose the protection layer 50 formed on the end portions of the exposed through electrodes 20.

A liquid photoresist may be coated on the protection layer 50 that is formed on the second surface 14 of the substrate 10, the sidewall 42 and the bottom surface 44 of the opening 40, and then, be dried to form the photoresist pattern. For example, after the liquid photoresist is dispensed on the upper sidewall of the opening 40 and then flows along the inclined sidewall 42 to the bottom surface 44 of the opening 40, the liquid photoresist may be dried to form the photoresist pattern. Accordingly, the insulation layer 22 that is formed on the end portion of the exposed through electrode 20 may be exposed by the photoresist pattern 60.

Figure 11:
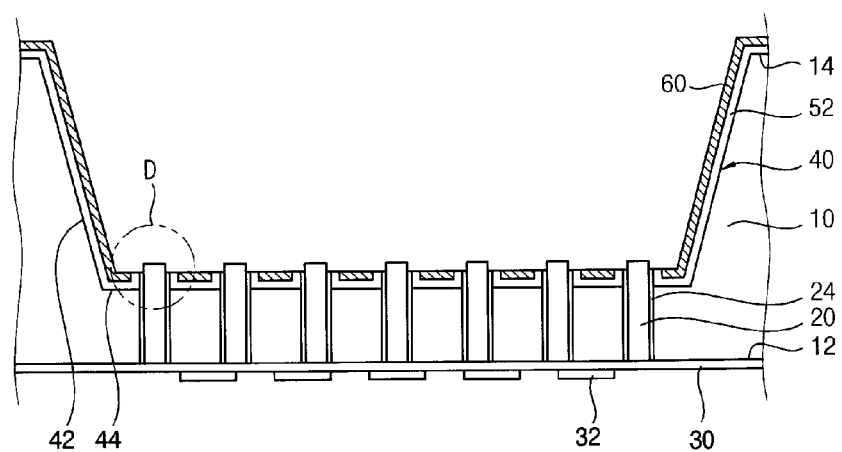
Figure 12:
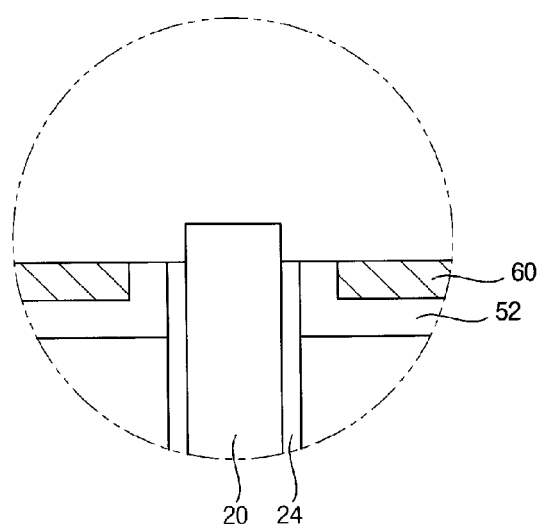

Referring to FIGS. 11 and 12, the protection layer 50 exposed by the photoresist pattern 60 may be partially removed to form the protection layer pattern 52 that exposes the end portion of the through electrode 20.

For example, the protection layer 50 and the insulation layer 22 exposed by the photoresist pattern 60 may be partially removed by a dry etching process to form the protection layer pattern 52 and an insulation layer pattern that expose the end portion of the through electrode 20.

Then, the photoresist pattern 60 may be removed from the substrate 10. Accordingly, the end portions of the through electrodes 20 may be exposed by the protection layer pattern 52 and protrude from the bottom surface 44 of the opening 40.

Thus, a first semiconductor chip may be formed in the die region (DA) of the wafer. The first semiconductor chip may include the substrate 10 having the opening 40 extending into a predetermined depth from the second surface 14 and a plurality of the through electrodes 20 extending in a thickness direction from the first surface 12, the end portions of the through electrodes 20 exposed through the bottom surface 44 of the opening 40.

Figure 13:
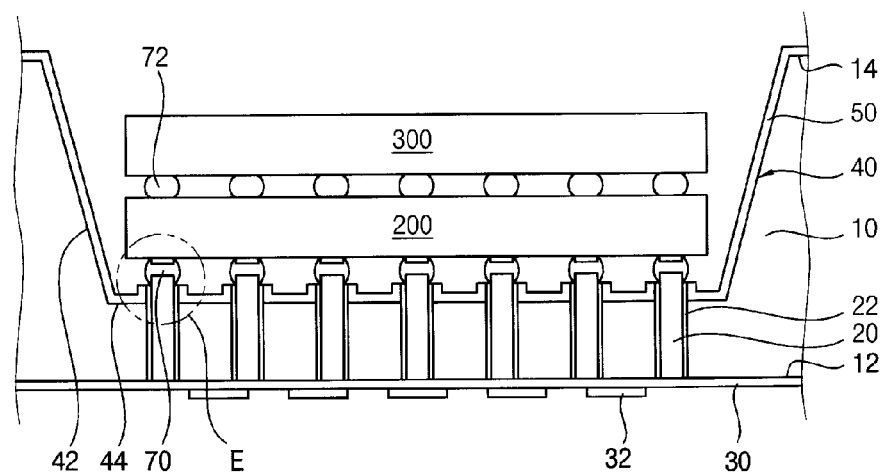
Figure 14:
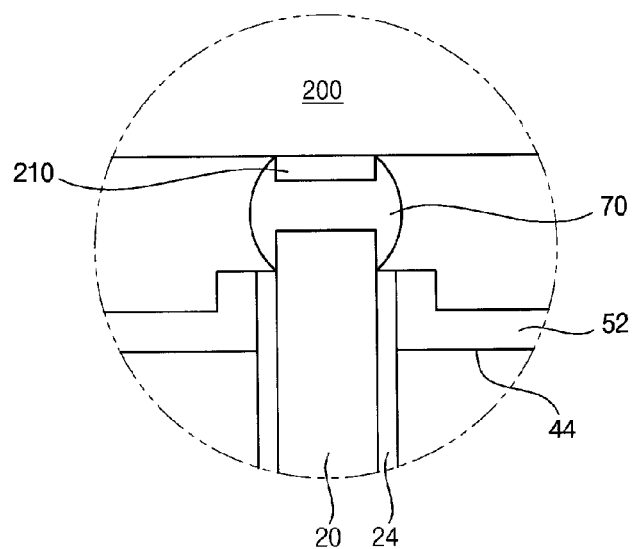
Figure 15:
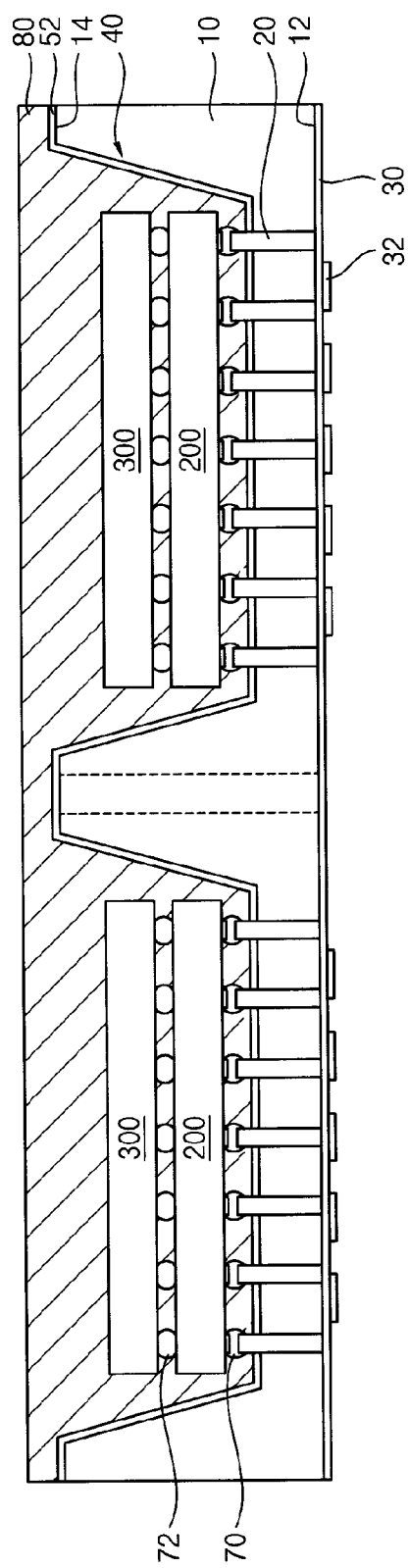

Referring to FIGS. 13 to 15, a second semiconductor chip 200 may be mounted on the bottom surface of the opening 40 and a third semiconductor chip 300 may be stacked on the second semiconductor chip 300. Then, a sealing member 80 may be formed in the opening 40 to cover the second semiconductor chip 200 and the third semiconductor chip 300.

In an embodiment, the second semiconductor chip 200 may be mounted by a flip chip bonding technology. The second semiconductor chip 200 may be mounted on the bottom surface 44 of the opening 40 via bumps 70 that are disposed on the end portions of the through electrodes 20 respectively. A connection pad 210 of the second semiconductor chip 200 may be electrically connected to the through electrode 20 that penetrates the substrate 10 by the bump 70.

The third semiconductor chip 300 may be stacked on the second semiconductor chip 200. The third semiconductor chip 300 may be electrically connected to the second semiconductor chip 200 by bumps 72.

Then, a molding layer may be coated on the second surface 14 of the substrate 10 to form the sealing member 80. For example, the molding layer may be formed using epoxy molding compound (EMC) by a molding process.

In the embodiment, after the second and third semiconductor chips 200, 300 are stacked in the opening 40, a wafer level molding process may be performed to form the sealing member 80 for the functions of underfilling and encapsulation. Since the sealing member 80 is formed in the opening 40 to cover the semiconductor chips, the amount of the sealing member 80 to be required to cover the semiconductor chips may be minimized, to thereby improve process reliability and reduce manufacturing costs.

Figure 16:
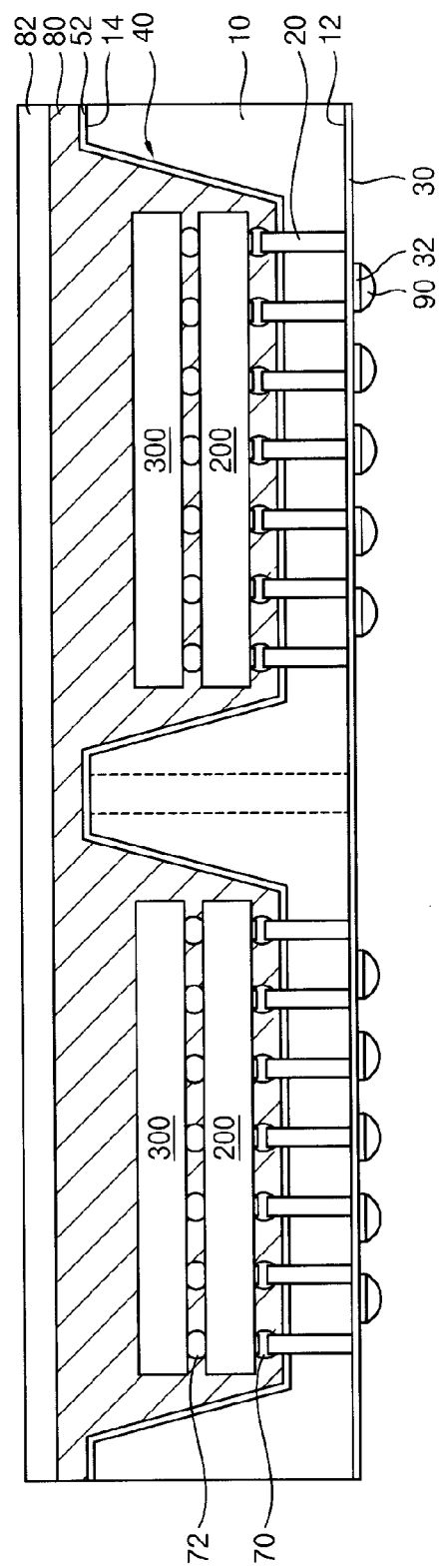
Figure 17:
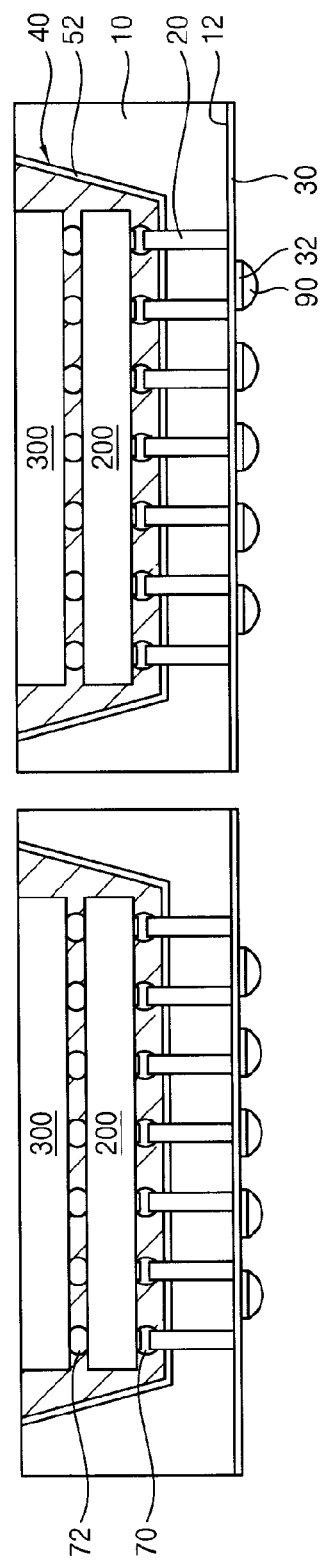

Referring to FIGS. 16 and 17, after a blocking layer 82 is formed on the sealing member 80, solder bumps 90 may be formed on the outer connection pads 32 on the first surface 12 of the substrate 10. Then, after the blocking layer 82 is removed, the substrate 10 may be diced along the cutting region (CA) to form a semiconductor package 100.

The blocking layer 82 may prevent the sealing member 80 from being polluted by a plating solution while the solder bump 90 is formed. The process of forming the blocking layer 82 may be omitted for simplicity.

In an embodiment, after the blocking layer 82 is removed, the sealing member 80 may be planarized to reduce the thickness of the semiconductor package 100. For example, the sealing member 80 may be planarized until the upper surface of the uppermost third semiconductor chip 300 is exposed. Accordingly, the thickness of the final semiconductor package 100 may be determined by the planarization process of the sealing member 80.

Then, the semiconductor package 100 may be mounted on a module substrate (not illustrated) via the solder bumps 90 on the outer connection pads 32 on the first substrate 12 of the substrate 10, to complete a memory module (not illustrated).

The semiconductor package according to the exemplary embodiment of the present general inventive concept may be applied to an electronic device such as a mobile phone. The electronic device may include a plurality of semiconductor chips for performing all or most of the functions of camera, MP3 player, digital multimedia broadcast (DMB), wireless internet, mobile banking, etc. The semiconductor package according to an embodiment of the present general inventive concept may include different kinds of semiconductor chips to implement various operations in the mobile phone. The electronic device may include note book, personal multimedia player (PMP), MP3 player, memory stick, memory card, etc.

Figure 18:
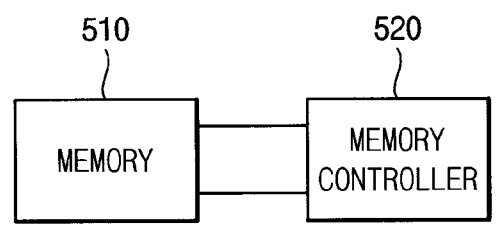
FIG. 18 illustrates an electronic apparatus having a semiconductor package according to an embodiment of the present general inventive concept.

FIG. 18 illustrates an electronic apparatus having a semiconductor package according to an embodiment of the present general inventive concept.

As illustrated in FIG. 18, the electronic apparatus includes a memory 510 connected to a memory controller 520. The memory 510 may include the memory device discussed above. The memory controller 520 supplies input signals for controlling operation of the memory. At least one of the memory 510 and the memory controller 520 may be the semiconductor package 100 illustrated in FIGS. 1-17. The other one of the memory 510 and the memory controller 520 may be connected to one or more solder bumps 90 of the semiconductor package 100 of FIGS. 1-17

Figure 19:
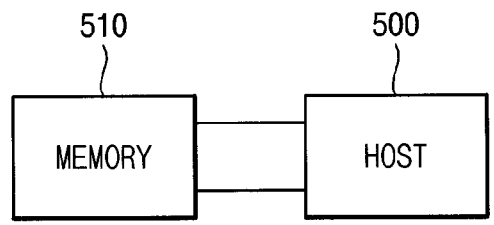
FIG. 19 illustrates an electronic apparatus having a semiconductor package according to an embodiment of the present general inventive concept.

FIG. 19 illustrates an electronic apparatus having a semiconductor package according to an embodiment of the present general inventive concept.

Referring to FIG. 19, The electronic apparatus includes a memory 510 connected with a host system 500. The memory 510 of FIG. 19 may include the memory 510 of FIG. 18.

The host system 500 may include an electric produce such as a personal computer, digital camera, mobile application, game machine, communication equipment, etc. The host system 500 supplies input signals to control an operation of the memory 510. The memory 510 is used as a data storage medium. The memory 510 may have a terminal corresponding to the solder bumps 90 to be electrically connected to the host system 500. It is possible that the memory 510 may be detachably attached to the host system 500. It is possible that the memory 510 may be installed in the host system 500. It is also possible that the memory may have an interface therein to communicate with the host system 500 to exchange signals or data according to a wired or wireless communication method.

Figure 20:
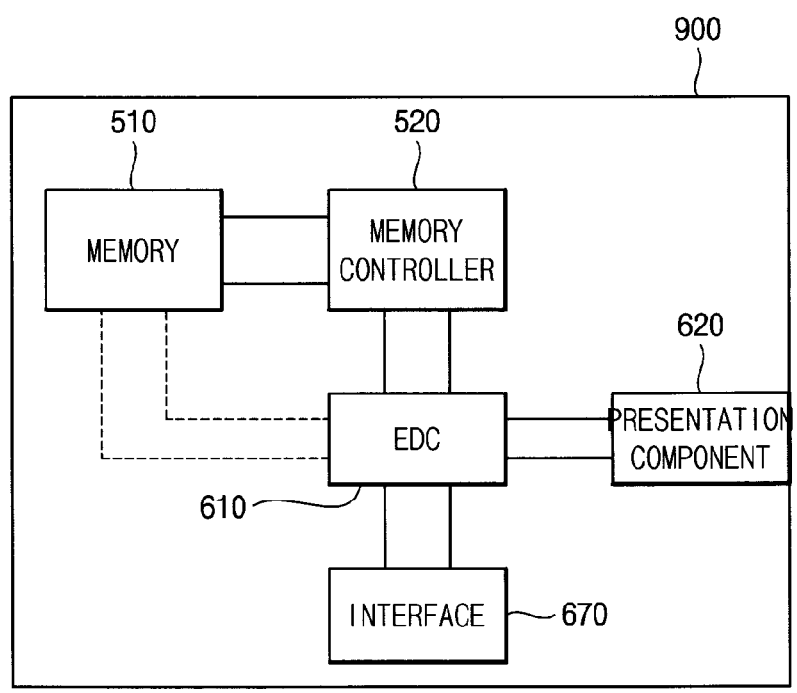
FIG. 20 illustrates an electronic apparatus having a semiconductor package according to an embodiment of the present general inventive concept.

FIG. 20 illustrates an electronic apparatus having a semiconductor package according to an embodiment of the present general inventive concept. The electronic apparatus may be a portable device 800. The portable device 800 may be an MP3 player, video player, combination video and audio player, mobile phone, tablet computer apparatus, laptop computer apparatus, etc. As illustrated above, the portable device 800 may include the memory 510 and memory controller 520.

The memory 510 may include the memory device discussed above. The portable device 800 may also includes an encoder/decoder EDC 610, a presentation component 620 and an interface 670. Data (video, audio, etc.) is inputted/outputted to/from the memory 510 via the memory controller 520 by the EDC 610.

As mentioned above, in a method of manufacturing a semiconductor package according to example embodiments, after a plurality of through electrodes is formed in a substrate to extend in a thickness direction from a lower surface of the substrate, an opening may be formed in a predetermined depth from an upper surface of the substrate to expose end portions of the through electrodes through a bottom surface of the opening. Then, after a semiconductor chip is mounted on the bottom surface of the opening in the opening, a sealing member may be formed in the opening to cove the semiconductor chip.

The middle portion of the substrate may be partially removed to form the opening that exposes the end portions of the through electrodes. Accordingly, the peripheral region of the substrate outside the opening may still have a relatively thick thickness. Therefore, since the wafer except the openings still has a relatively thick thickness to prevent the warpage of the wafer, following processes may be performed without using a high-cost wafer supporting system.

Additionally, without performing a planarization process on the whole surface of the wafer, a wet etching process may be performed on only a local surface of the wafer to form the opening that exposes the end portions of the through electrodes, to thereby prevent the through electrodes from being damaged.

Further, after the semiconductor chip is stacked in the opening, a wafer level molding process may be performed to form the sealing member for the functions of underfilling and encapsulation.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor package, comprising:
   a first semiconductor chip comprising:
      a substrate comprising a first surface, a second surface opposite to the first surface, and an opening defined by a bottom surface and at least one wall, the bottom surface being located a predetermined depth from the second surface and separated from the first surface by a predetermined thickness of the substrate; and
      a plurality of through electrodes extending in a thickness direction from the first surface, end portions of the through electrodes being exposed through the bottom surface of the opening;

a second semiconductor chip disposed in the opening and being mounted on the bottom surface of the opening; and a sealing member covering the second semiconductor chip in the opening.

2. The semiconductor package of claim 1, wherein the second semiconductor chip is electrically connected to the first semiconductor chip via bumps that are disposed on exposed end portions of the through electrodes.

3. The semiconductor package of claim 2, wherein the second semiconductor chip is mounted by a flip chip bonding technology.

4. The semiconductor package of claim 2, wherein the bumps surround the exposed end portions of the through electrodes of the first semiconductor chip and surround exposed surfaces of pads of the second semiconductor chip to electrically connect the first and second semiconductor chips.

5. The semiconductor package of claim 1, wherein the first semiconductor chip comprises circuit patterns on the first surface of the substrate.

6. The semiconductor package of claim 5, further comprising an upper insulation layer including wirings on the first surface of the substrate and the wirings are electrically connected to the circuit patterns.

7. The semiconductor package of claim 6, wherein a plurality of outer connection pads is formed on the upper insulation layer.

8. The semiconductor package of claim 1, further comprising a protection layer pattern on the at least one wall and the bottom surface of the opening to expose the end portions of the through electrodes.

9. The semiconductor package of claim 8, wherein the pattern protection layer is formed along a profile of an insulation layer of the through electrodes.

10. The semiconductor package of claim 1, wherein the at least one wall of the opening comprises an inclination angle with respect to a direction perpendicular to the substrate.

11. The semiconductor package of claim 1, wherein the first semiconductor chip is a logic chip including a logic circuit and the second semiconductor chip is a memory chip including a memory circuit.

12. The semiconductor package of claim 1, further comprising a third semiconductor chip disposed in the opening and stacked on the second semiconductor chip.

13. A semiconductor package usable with an electronic apparatus, comprising:

a first semiconductor chip including a substrate and an opening formed in the substrate, the opening being defined by a bottom surface and at least one side wall;

one or more second semiconductor chips disposed in the opening of the substrate; and a sealing member disposed in the opening to cover the one or more second semiconductor chips, wherein the substrate comprises one or more through electrodes exposed from the bottom surface of the substrate, the one or more second semiconductor chips are disposed on the one or more through electrodes opening, and the sealing member is formed between adjacent through electrode.

14. The semiconductor package of claim 13, wherein the sealing member is disposed between the one or more second semiconductor chips and a surface formed with the bottom surface and the at least one side wall of the opening.

15. The semiconductor package of claim 13, wherein the at least one side wall has a width variable according to a height from the bottom surface.

16. The semiconductor package of claim 13, wherein:

the substrate of the first semiconductor chip comprises one or more solder bumps connectable to a controller of the electronic apparatus; and the controller of the electronic apparatus performs an operation according to data received from the semiconductor package.

* * * * *